(12) United States Patent
Suzuki

(10) Patent No.: US 7,794,788 B2
(45) Date of Patent: Sep. 14, 2010

(54) METHOD FOR PRE-CONDITIONING A PRECURSOR VAPORIZATION SYSTEM FOR A VAPOR DEPOSITION PROCESS

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 805 days.

(21) Appl. No.: 11/692,816

(22) Filed: Mar. 28, 2007

(65) Prior Publication Data
US 2008/0241381 A1    Oct. 2, 2008

(51) Int. Cl.
*C23C 16/00*    (2006.01)
(52) U.S. Cl. ............................ 427/255.28; 427/255.23; 118/715
(58) Field of Classification Search ............ 427/255.23, 427/255.28; 118/715
See application file for complete search history.

(56) References Cited

U.S. PATENT DOCUMENTS 5,904,170 A * 5/1999 Harvey et al. .................. 137/9
7,485,338 B2 * 2/2009 Faguet ..................... 427/248.1
2005/0081882 A1 * 4/2005 Greer et al. ................... 134/1.1

* cited by examiner

*Primary Examiner*—Shamim Ahmed
*Assistant Examiner*—Mahmoud Dahimene
(74) *Attorney, Agent, or Firm*—Wood, Herron & Evans, LLP

(57) ABSTRACT

A method for pre-conditioning a film precursor vaporization system configured to supply a film precursor vapor to a deposition system for performing a deposition process is described. Prior to the deposition process, the gas pressure within the film precursor vaporization system is adjusted to a pre-determined target pressure. For example, the gas pressure within the film precursor vaporization system can be adjusted to a pressure consistent with a flow of process gas containing the film precursor vapor and a carrier gas to the deposition system at a flow rate utilized during the deposition process without introducing the process gas to the deposition system prior to the deposition process.

21 Claims, 12 Drawing Sheets

METHOD FOR PRE-CONDITIONING A PRECURSOR VAPORIZATION SYSTEM FOR A VAPOR DEPOSITION PROCESS

BACKGROUND OF THE INVENTION

1. Field of the Invention

The present invention relates to a method for thin film deposition, and more particularly to a method for pre-conditioning a precursor evaporation system prior to performing a deposition process for depositing a thin film.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperature between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electro-chemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of ruthenium carbonyl precursors (e.g., $Ru_3(CO)_{12}$) can deteriorate when the substrate temperature is lowered to below about 400° C. As a result, an increase in the (electrical) resistivity of the Ru layers and poor surface morphology (e.g., the formation of nodules) at low deposition temperatures has been attributed to increased incorporation of reaction by-products into the thermally deposited Ru layers. Both effects can be explained by a reduced carbon monoxide (CO) desorption rate from the thermal decomposition of the ruthenium carbonyl precursor at substrate temperatures below about 400° C.

Additionally, the use of metal carbonyls, such as ruthenium carbonyl or rhenium carbonyl, can lead to poor deposition rates due to their low vapor pressure, and the transport issues associated therewith. Overall, the inventors have observed that current deposition systems suffer from such a low rate, making the deposition of such metal films impractical. Furthermore, the inventors have observed that current deposition systems suffer from poor film uniformity.

SUMMARY OF THE INVENTION

A method is provided for pre-conditioning a film precursor vaporization system in a thin film deposition system.

Further yet, a method is provided for pre-conditioning a film precursor vaporization system prior to a deposition process for depositing metal-containing films using metal carbonyl precursors.

According to one embodiment, a method of, and computer readable medium for, depositing a thin film on a substrate is described, comprising: providing the substrate within a deposition system configured to perform a deposition process; heating the substrate to a deposition temperature; providing an exhaust system; providing a film precursor vaporization system coupled to the deposition system and the exhaust system, and configured to supply a film precursor vapor from a film precursor stored therein; determining a target pressure for operating the film precursor vaporization system during the deposition process; establishing a first flow of process gas containing the film precursor vapor and the carrier gas at a deposition flow rate to the exhaust system without introducing the first flow of process gas to the deposition system; adjusting the first flow of process gas to the exhaust system to be at a different flow rate than the deposition flow rate in order to establish a gas pressure within the film precursor vaporization system that is substantially equivalent to the target pressure; terminating the first flow of the process gas; establishing a second flow of the process gas to the deposition system at the deposition flow rate; and exposing the substrate at the deposition temperature to the process gas to deposit the thin film on the substrate using the deposition process. The computer readable medium contains program instructions for execution on the deposition system, which when executed by the deposition system, cause the deposition system to perform the steps described above.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
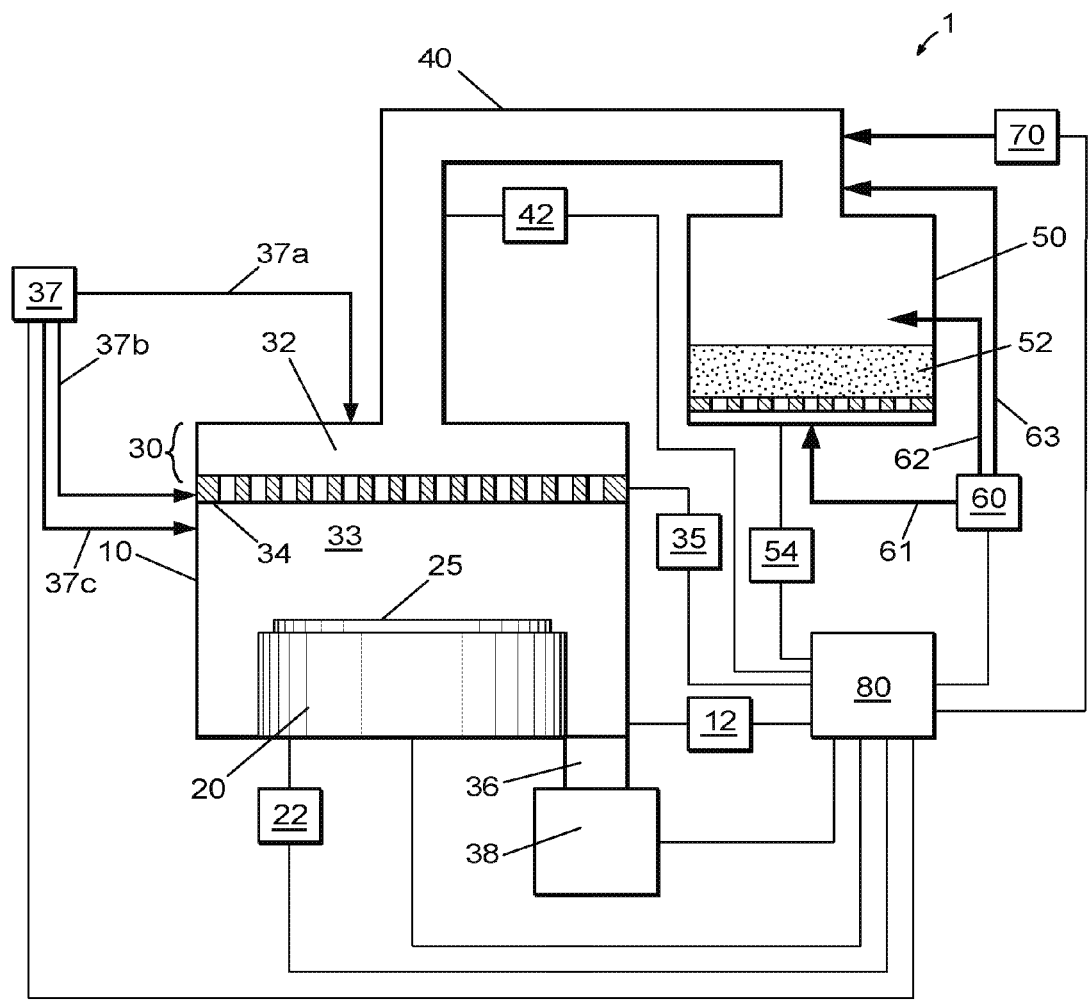
FIG. 1 depicts a schematic view of a deposition system according to an embodiment.

Referring now to the drawings, wherein like reference numerals designate identical or corresponding parts throughout the several views, FIG. 1 schematically illustrates a deposition system 1 for depositing a thin film, such as a metal film or a metal-containing film. The thin film may include materials suitable for use as seed layers or barrier layers in the metallization of inter-/intra-connect structures in electronic devices; materials suitable for use as gate dielectrics in electronic devices; or materials suitable for use as capacitor dielectrics in DRAM devices. For example, the thin film may include a metal, metal oxide, metal nitride, metal oxynitride, metal silicate, metal silicide, etc. The deposition system 1 may include any vapor deposition system configured to form a thin film from a film precursor vapor including, but not limited to: a chemical vapor deposition (CVD) system, a plasma-enhanced CVD (PECVD) system, an atomic layer deposition (ALD) system, a plasma-enhanced ALD (PEALD) system, etc.

According to one embodiment, a metal layer is deposited on a substrate from a metal carbonyl precursor using a thermal chemical vapor deposition system. While other metal carbonyl precursors may be used, embodiments of the invention may henceforth be described with particular reference to ruthenium carbonyl, such as $Ru_3(CO)_{12}$, with the understanding that the invention is not so limited. The deposition system 1 comprises a process chamber 10 having a substrate holder 20 configured to support a substrate 25, upon which the thin film, such as a metal layer, is formed. The process chamber 10 is coupled to a film precursor vaporization system 50 via a vapor precursor delivery system 40.

The process chamber 10 is further coupled to a vacuum pumping system 38 through a duct 36, wherein the vacuum pumping system 38 is configured to evacuate the process chamber 10, vapor precursor delivery system 40, and film precursor vaporization system 50 to a pressure suitable for forming the metal layer on the substrate 25, and suitable for evaporation (or sublimation) of the metal carbonyl precursor 52 in the film precursor vaporization system 50.

Still referring to FIG. 1, the film precursor vaporization system 50 is configured to store a metal carbonyl precursor 52, to heat the metal carbonyl precursor 52 to a temperature sufficient for vaporizing the metal carbonyl precursor 52, and to introduce metal carbonyl precursor vapor to the vapor precursor delivery system 40. The metal carbonyl precursor 52 can be solid under the selected heating conditions in the film precursor vaporization system 50. Alternately, the metal carbonyl precursor 52 can be a liquid. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. Below, the use of a solid metal carbonyl precursor 52 is described; however, those skilled in the art will appreciate that metal carbonyl precursors that are liquids under the selected heating conditions can be used without departing from the scope of the invention. For instance, the metal carbonyl precursor can have the general formula $M_x(CO)_y$, and can comprise a tungsten carbonyl, a nickel carbonyl, a molybdenum carbonyl, a cobalt carbonyl, a rhodium carbonyl, a rhenium carbonyl, a chromium carbonyl, a ruthenium carbonyl, or an osmium carbonyl, or a combination of two or more thereof. These metal carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

In order to achieve the desired temperature for vaporizing the metal carbonyl precursor 52 (e.g., subliming the solid metal carbonyl precursor 52), the film precursor vaporization system 50 is coupled to a vaporization temperature control system 54 configured to control the vaporization temperature. For instance, the temperature of the metal carbonyl precursor 52 is generally elevated to approximately 40° C. to 45° C. in conventional systems in order to sublime the ruthenium carbonyl ($Ru_3(CO)_{12}$). At this temperature, the vapor pressure of the $Ru_3(CO)_{12}$, for instance, ranges from approximately 1 to approximately 3 mTorr. As the metal carbonyl precursor is heated to cause evaporation (or sublimation), a carrier gas can be passed over or through the metal carbonyl precursor 52, or any combination thereof. The carrier gas can include, for example, an inert gas, such as a noble gas, He, Ne, Ar, Kr, or Xe, or a combination of two or more thereof. Alternately, other embodiments contemplate omitting the inert carrier gas. Additionally, a monoxide gas, such as carbon monoxide (CO), can be added to the inert carrier gas. Alternately, other arrangements contemplate the monoxide gas replacing the inert carrier gas.

For example, a gas supply system 60 is coupled to the film precursor vaporization system 50, and it is configured to, for instance, supply a carrier gas, such as an inert gas, or a CO gas, or a mixture thereof, beneath the metal carbonyl precursor 52 via feed line 61, or over the metal carbonyl precursor 52 via feed line 62. In addition, or in the alternative, the gas supply system 60 is coupled to the vapor precursor delivery system 40 downstream from the film precursor vaporization system 50 to supply the gas to the vapor of the metal carbonyl precursor 52 via feed line 63 as or after it enters the vapor precursor delivery system 40.

Although not shown, the gas supply system 60 can comprise a carrier gas source, such as a CO gas source or an inert gas source or both, one or more control valves, one or more filters, and a mass flow controller. For instance, the flow rate of the carrier gas can be between about 0.1 standard cubic centimeters per minute (sccm) and about 1000 sccm. Alternately, the flow rate of the carrier gas can be between about 10 sccm and about 500 sccm. Still alternately, the flow rate of the carrier gas can be between about 50 sccm and about 200 sccm.

Downstream from the film precursor vaporization system 50, the metal precursor vapor flows with the carrier gas through the vapor precursor delivery system 40 until it enters a vapor distribution system 30 coupled to or within the process chamber 10. The vapor precursor delivery system 40 can be coupled to a vapor line temperature control system 42 in order to control the vapor line temperature and prevent decomposition of the film precursor vapor as well as condensation of the film precursor vapor. For example, the vapor line temperature can be set to a value approximately equal to or greater than the vaporization temperature. Additionally, for example, the vapor precursor delivery system 40 can be characterized by a high conductance in excess of about 50 liters/second.

Referring again to FIG. 1, the vapor distribution system 30, coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

Additionally, a dilution gas source 37 may optionally be coupled to the process chamber 10 and/or vapor distribution system 30 and may be configured to add a dilution gas to dilute the process gas containing the metal carbonyl precursor vapor and the carrier gas. As shown in FIG. 1, the dilution gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the dilution gas source 37 can be coupled to the process chamber 10 via feed line 37b and configured to add the dilution gas to the process gas in the processing zone 33 above the substrate 25 after the process gas passes through the vapor distribution plate 34. Still alternately, the dilution gas source 37 can be coupled to the vapor distribution system 30 via feed line 37c and configured to add the dilution gas to the process gas in the vapor distribution plate 34. As will be appreciated by those skilled in the art, the dilution gas can be added to the process gas at other locations in the vapor distribution system 30 and the process chamber 10 without departing from the scope of the invention.

Additionally yet, the dilution gas is introduced to the process gas from the dilution gas source 37 through one of feed lines 37a, 37b, 37c, or other feed lines (not shown) in such a way that the concentration of dilution gas at one region above substrate 25 can be adjusted to be different than the concentration of dilution gas at another region above substrate 25. For example, the flow of dilution gas to a central region of substrate 25 can be different than the flow of dilution gas to a peripheral region of substrate 25.

Once film precursor vapor enters the processing zone 33, the film precursor vapor thermally decomposes upon adsorption at the substrate surface due to the elevated temperature of the substrate 25, and the thin film is formed on the substrate 25. The substrate holder 20 is configured to elevate the temperature of substrate 25 by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 150° C. to about 350° C. Additionally, process chamber 10 can be coupled to a chamber temperature control system 12 configured to control the temperature of the chamber walls.

As described above, for example, conventional systems have contemplated operating the film precursor vaporization system 50, as well as the vapor precursor delivery system 40, within a temperature range of approximately 40-45° C. for ruthenium carbonyl in order to limit metal vapor precursor decomposition and metal vapor precursor condensation. For example, the ruthenium carbonyl precursor can decompose at elevated temperatures to form by-products, such as those illustrated below:

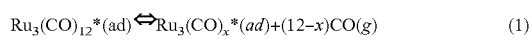

or,

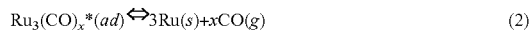

wherein these by-products can adsorb (ad), i.e., condense, on the interior surfaces of the deposition system 1. The accumulation of material on these surfaces can cause problems from one substrate to the next, such as process repeatability. Alternatively, for example, the ruthenium carbonyl precursor can condense at depressed temperatures to cause recrystallization, viz.

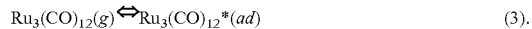

In summary, the low vapor pressure of some metal carbonyl precursors (e.g., $Ru_3(CO)_{12}$) and the small process window result in a very low deposition rate of a metal layer on the substrate 25.

Adding a CO gas as a carrier gas to the metal carbonyl precursor vapor can reduce the above-mentioned problems that limit the delivery of the metal carbonyl precursor to the substrate. Thus, according to an embodiment, the CO gas is added to the metal carbonyl precursor vapor to reduce dissociation of the metal carbonyl precursor vapor in the gas line, thereby shifting the equilibrium in Equation (1) to the left and reducing premature decomposition of the metal carbonyl precursor in the vapor precursor delivery system 40 prior to delivery of the metal carbonyl precursor to the process chamber 10. It is believed that addition of the CO gas to the metal carbonyl precursor vapor allows for increasing the vaporization temperature from approximately 40° C. to approximately 150° C., or higher. The elevated temperature increases the vapor pressure of the metal carbonyl precursor, resulting in increased delivery of the metal carbonyl precursor to the process chamber and, hence, increased deposition rate of the metal on the substrate 25. Furthermore, it has been visually observed that flowing a mixture of an inert gas, such as Ar, and the CO gas over or through the metal carbonyl precursor reduces premature decomposition of the metal carbonyl precursor.

Accordingly, the addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Thermal decomposition of metal carbonyl precursors and subsequent metal deposition on the substrate 25 is thought to proceed predominantly by CO elimination and desorption of CO by-products from the substrate 25. Incorporation of CO by-products into the metal layers during deposition can result from incomplete decomposition of the metal carbonyl precursor, incomplete removal of CO by-products from the metal layer, and re-adsorption of CO by-products from the process chamber 10 onto the metal layer.

It is believed that CO incorporation into a metal layer during deposition leads to surface roughness in the form of nodules in the metal layer, where the growth of nodules is enhanced by increased incorporation of CO by-products into the metal layer. The number of nodules is expected to increase as the thickness of the metal layer increases. Furthermore, the incorporation of CO by-products into the metal layer increases the resistivity of the metal layer.

Incorporation of CO by-products into the metal layer can be reduced by (1) lowering the process pressure, and (2) increasing the substrate temperature. The above-mentioned problems can also be reduced by adding a dilution gas in the process chamber 10 to the process gas containing the metal carbonyl precursor vapor and the CO gas for controlling and reducing the partial pressure of by-products and the CO gas in the process chamber. Thus, according to an embodiment of the invention, a dilution gas from dilution gas source 37 is added to the process gas for controlling and reducing the partial pressure of CO by-products on the metal layer and the partial pressure of CO in the process chamber 10, thereby forming a smooth metal layer. The dilution gas can include, for example, an inert gas, such as a noble gas, He, Ne, Ar, Kr, or Xe, or a mixture of two or more thereof. The dilution gas may further contain a reducing gas to improve the material properties of the metal layer, for example the electrical resistivity. The reducing gas can, for example, contain $H_2$, a silicon-containing gas (e.g., $SiH_4$, $Si_2H_6$, or $SiCl_2H_2$), a boron-containing gas (e.g., $BH_3$, $B_2H_6$, or $B_3H_9$), or a nitrogen-containing gas (e.g., $NH_3$). According to an embodiment of the invention, the process chamber pressure can be between about 0.1 mTorr and about 200 mTorr. Alternately, the process chamber pressure can be between about 1 mTorr and about 200 mTorr. Still alternately, the process chamber pressure can be between about 10 mTorr and about 200 mTorr.

Since the addition of the CO gas to the metal carbonyl precursor vapor increases the thermal stability of the metal carbonyl precursor vapor, the relative concentration of the metal carbonyl precursor vapor to the CO gas in the process gas can be utilized to control the decomposition rate of the metal carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired vaporization temperature of the metal carbonyl precursor and for achieving a desired deposition rate of the metal carbonyl precursor on the substrate 25.

Furthermore, the amount of CO gas in the process gas can be selected so that metal deposition on the substrate 25 from a metal carbonyl precursor occurs in a kinetic-limited temperature regime. For example, the amount of CO gas in the process gas can be increased until the metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on metal carbonyl precursor flow rate and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall. Step coverage is commonly defined as the sidewall coverage (metal layer thickness on sidewall divided by the metal layer thickness away from the feature) divided by the bottom coverage (metal layer thickness on the bottom of the feature divided by the metal layer thickness away from the feature).

Additionally, in accordance with the present invention, it is observed that the stability of film deposition and the resultant properties of the deposited film can be affected by variations in the flow of CO gas and precursor vapor to the deposition system. For example, during the initial introduction of CO gas and precursor vapor to the deposition system, flow variations may occur until the flow rate stabilizes through the metal precursor vaporization system, the vapor delivery system, and the vapor distribution system. According to one embodiment, as will be described later, a sequence of process steps are performed prior to the deposition process in order to, for example stabilize system conditions.

Still referring to FIG. 1, optionally, the deposition system 1 can be periodically cleaned using an in-situ cleaning system 70 coupled to, for example, the vapor precursor delivery system 40, as shown in FIG. 1. Per a frequency determined by the operator, the in-situ cleaning system 70 can perform routine cleanings of the deposition system 1 in order to remove accumulated residue on internal surfaces of deposition system 1. The in-situ cleaning system 70 can, for example, comprise a radical generator configured to introduce chemical radical capable of chemically reacting and removing such residue. Additionally, for example, the in-situ cleaning system 70 can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the film precursor vaporization system 50, the carrier gas supply system 60, the dilution gas source 37, and the optional in-situ cleaning system 70.

Figure 2:
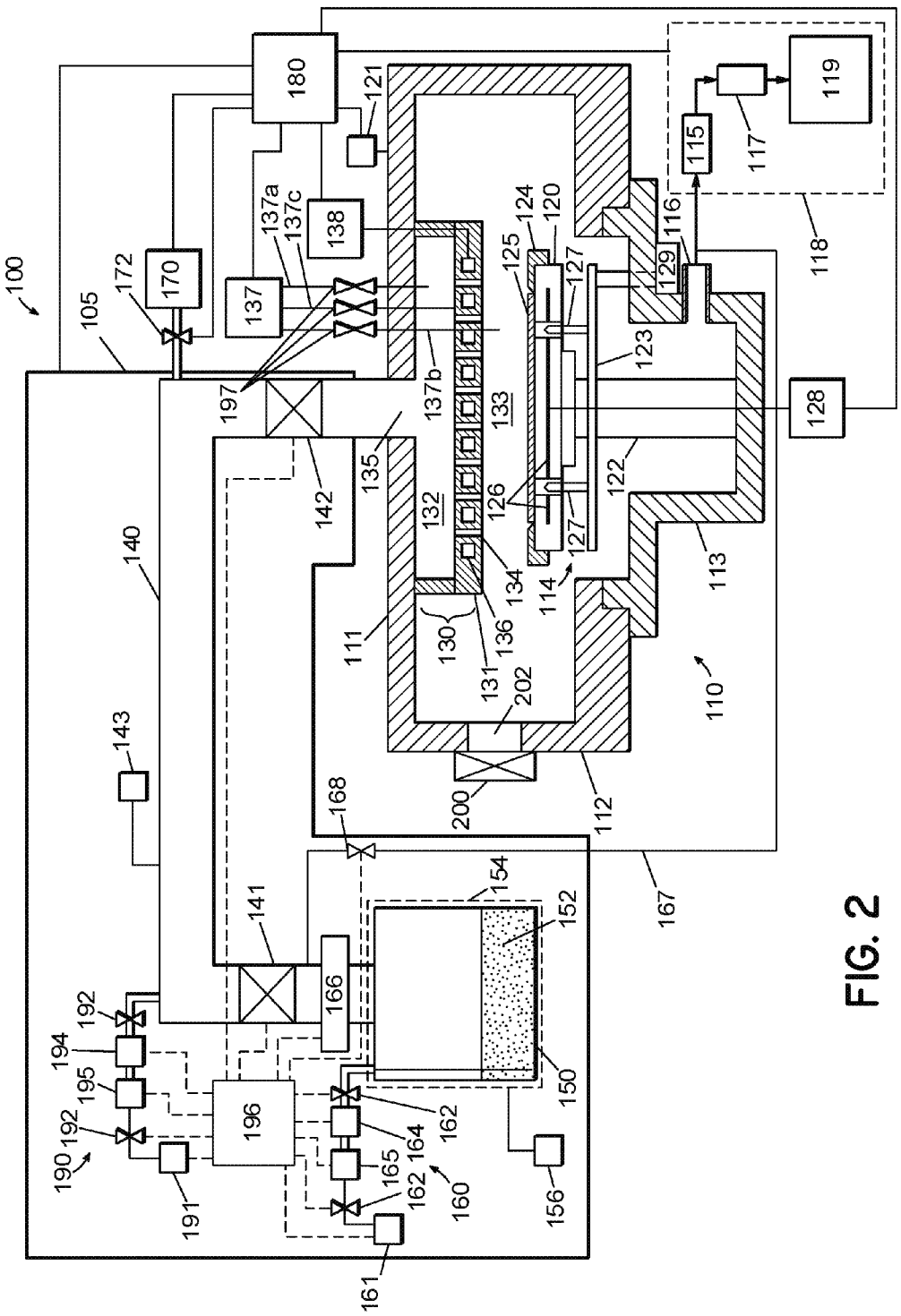
FIG. 2 depicts a schematic view of a deposition system according to another embodiment.

In another embodiment, FIG. 2 illustrates a deposition system 100 for depositing a metal film, such as a ruthenium (Ru) film, on a substrate. The deposition system 100 comprises a process chamber 110 having a substrate holder 120 configured to support a substrate 125 upon which the metal layer is formed. The process chamber 110 is coupled to a precursor delivery system 105 having film precursor vaporization system 150 configured to store and evaporate a metal carbonyl precursor 152, and a vapor precursor delivery system 140 configured to transport the metal carbonyl precursor 152 to the process chamber 110.

The process chamber 110 comprises an upper chamber section 111, a lower chamber section 112, and an exhaust chamber 113. An opening 114 is formed within lower chamber section 112, where lower chamber section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. A shield ring 124 for reducing CO poisoning on the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the metal carbonyl precursor vapor, and enable deposition of a metal layer on the substrate 125. According to an embodiment, the metal carbonyl precursor 152 can be a ruthenium carbonyl precursor, for example $Ru_3(CO)_{12}$. As will be appreciated by those skilled in the art of thermal chemical vapor deposition, other metal carbonyl precursors and other ruthenium carbonyl precursors can be used without departing from the scope of the invention. The substrate holder 120 is heated to a pre-determined temperature that is suitable for depositing the desired Ru metal layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

According to an embodiment of the invention, a dilution gas source 137 is coupled to the process chamber 110 and is configured to add a dilution gas to dilute the process gas containing the metal carbonyl precursor vapor and the CO gas using feed lines 137a, 137b, and/or 137c, valves 197, one or more filters (not shown), and a mass flow controller (not shown). As shown in FIG. 2, the dilution gas source 137 can be coupled to the vapor distribution system 130 of process chamber 110 and is configured to add the dilution gas to the process gas in the vapor distribution plenum 132 via feed line 137a before the process gas passes through the vapor distribution plate 131 into the processing zone 133 above the substrate 125, or the dilution gas source 137 can be configured to add the dilution gas to the process gas inside the vapor distribution plate 131 via feed line 137c. Alternately, the dilution gas source 137 can be coupled to the process chamber 110 and is configured to add the dilution gas to the process gas in the processing zone 133 via feed line 137b after the process gas passes through the vapor distribution plate 131. As will be appreciated by those skilled in the art, the dilution gas can be added to the process gas at other locations in the process chamber 110 without departing from the scope of the invention.

In yet another embodiment, the dilution gas is introduced to the process gas from the dilution gas source 137 through one of feed lines 137a, 137b, 137c, or other feed lines (not shown) in such a way that the concentration of dilution gas at one region above substrate 125 can be adjusted to be different than the concentration of dilution gas at another region above substrate 125. For example, the flow of dilution gas to a central region of substrate 125 can be different than the flow of dilution gas to a peripheral region of substrate 125.

Furthermore, an opening 135 is provided in the upper chamber section 111 for introducing a metal carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the metal carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a film precursor vaporization system 150 is configured to hold a metal carbonyl precursor 152 and evaporate (or sublime) the metal carbonyl precursor 152 by elevating the temperature of the metal carbonyl precursor. A precursor heater 154 is provided for heating the metal carbonyl precursor 152 to maintain the metal carbonyl precursor 152 at a temperature that produces a desired vapor pressure of metal carbonyl precursor 152. The precursor heater 154 is coupled to a vaporization temperature control system 156 configured to control the temperature of the metal carbonyl precursor 152. For example, the precursor heater 154 can be configured to adjust the temperature of the metal carbonyl precursor 152 from about 40° C. to about 150° C., or from about 60° C. to about 90° C.

As the metal carbonyl precursor 152 is heated to cause evaporation (or sublimation), a carrier gas can be passed over or through the metal carbonyl precursor 152, or any combination thereof. The carrier gas can include, for example, an inert gas, such as a noble gas (i.e., He, Ne, Ar, Kr, Xe). Alternately, other embodiments contemplate omitting the inert carrier gas. According to an embodiment of the invention, a CO gas can be added to the inert carrier gas. Alternately, other embodiments contemplate the CO gas replacing the inert carrier gas. For example, a gas supply system 160 is coupled to the film precursor vaporization system 150, and it is configured to, for instance, flow the carrier gas, the CO gas, or both, over or through the metal carbonyl precursor 152. Although not shown in FIG. 2, gas supply system 160 can also or alternatively be coupled to the vapor precursor delivery system 140 to supply the CO gas and optional inert carrier gas to the vapor of the metal carbonyl precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of inert carrier gas or the CO gas can range from approximately 0.1 sccm to approximately 1000 sccm.

Additionally, a sensor 166 is provided for measuring the total gas flow from the film precursor vaporization system 150. The sensor 166 can, for example, comprise a mass flow controller, and the amount of metal carbonyl precursor vapor delivered to the process chamber 110 can be determined using sensor 166 and mass flow controller 165. Alternately, the sensor 166 can comprise a light absorption sensor to measure the concentration of the metal carbonyl precursor in the gas flow to the process chamber 110.

A bypass line 167 can be located downstream from sensor 166, and it can connect the vapor precursor delivery system 140 to an exhaust line 116. Bypass line 167 is provided for evacuating the vapor precursor delivery system 140, and for stabilizing the supply of the metal carbonyl precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the metal carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the metal carbonyl precursor vapor in the vapor precursor delivery system, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the metal carbonyl precursor vapor. Sensor 166 is also connected to controller 196 and, based on output of the sensor 166, controller 196 can control the carrier gas flow through mass flow controller 165 to obtain the desired metal carbonyl precursor flow to the process chamber 110.

Furthermore, as described above, and as shown in FIG. 2, an optional in-situ cleaning system 170 is coupled to the precursor delivery system 105 of deposition system 100 through cleaning valve 172. For instance, the in-situ cleaning system 170 can be coupled to the vapor precursor delivery system 140. The in-situ cleaning system 170 can, for example, comprise a radical generator configured to introduce chemical radical capable of chemically reacting and removing such residue. Additionally, for example, the in-situ cleaning system 170 can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $ClF_3$, $O_3$, $XeF_2$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

As illustrated in FIG. 2, the exhaust line 116 connects exhaust chamber 113 to vacuum pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted metal carbonyl precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the deposition system 100 as well as monitor outputs from the deposition system 100. Moreover, the controller 180 is coupled to and exchanges information with process chamber 110; precursor delivery system 105, which includes controller 196, vapor line temperature control system 143, film precursor vaporization system 150, gas supply system 190, gas supply system 160, and vaporization temperature control system 156; vapor distribution temperature control system 138; dilution gas source 137; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via the internet or an intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

As described above, it is observed that the stability of film deposition and the resultant properties of the deposited film can be affected by variations in process conditions within the deposition system. Variations of pressure, precursor vapor flow rate, carrier gas flow rate, substrate temperature, etc. are examples of various process conditions that may influence the stability and repeatability of film properties.

According to one example, during the initial introduction of CO gas and precursor vapor to the deposition system, flow variations may occur while the flow rate stabilizes through the film precursor vaporization system, the vapor delivery system, and the vapor distribution system. The inventor has observed that these flow variations can affect film properties and the repeatability of film properties. Therefore, it is desirable to stabilize the flow rate of precursor vapor and carrier gas prior to initiating the deposition process.

According to another example, when initiating the flow of carrier gas through the film precursor vaporization system, sudden changes in pressure during the initial stages of flowing gas through the precursor vaporization system can cause variations in flow conditions and increased particle contamination. The inventor has observed that these pressure variations can affect film properties and the repeatability of film properties. Therefore, it is desirable to stabilize the pressure within the film precursor vaporization system prior to initiating the deposition process.

According to yet another example, when heating the substrate to the deposition temperature prior to the deposition process, the chamber environment within the deposition system, such as pressure, gas composition, etc., may be different than the chamber environment for the deposition process. The inventor has observed that a change from an inert gas environment, such as an argon environment, to a CO gas environment can affect the temperature stability of the substrate, which, in turn, can affect film properties and the repeatability of film properties. Therefore, it is desirable to stabilize the temperature of the substrate prior to initiating the deposition process.

Referring now to FIGS. 3A through 3H, a vapor supply system 305 for introducing a film precursor vapor, derived from a film precursor 352 contained within a film precursor vaporization system 350, to a deposition system 310 is described. Furthermore, a method of initiating a deposition process to be performed within the deposition system 310 is illustrated in FIG. 4. The method comprises a flow chart 500 depicting a sequence of process steps that are performed prior to the deposition process according to an embodiment. For example, the deposition process is performed according to a deposition process condition that may include: operating at a pre-determined flow rate of carrier gas, operating at a pre-determined flow rate of film precursor vapor, operating at a pre-determined chamber pressure within the deposition system, operating at a pre-determined substrate temperature, etc.

As shown in FIG. 4, in step 510, a substrate is provided in a process space of the deposition system 310. For example, the deposition system 310 can include the depositions systems 1 or 100 described above in FIGS. 1 and 2. The substrate can, for example, be a silicon (Si) substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof.

Figure 3A:
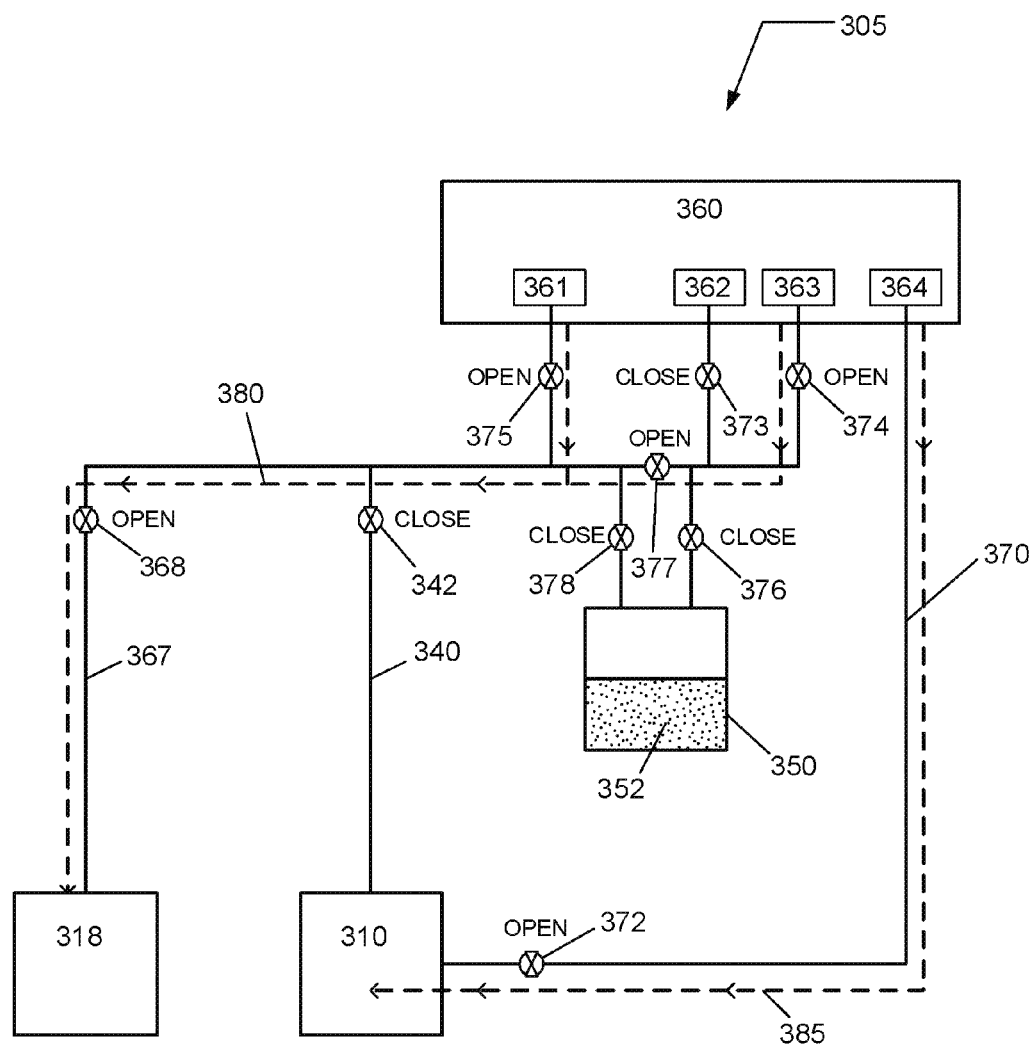
FIGS. 3A through 3H depict a process flow diagram for establishing a flow of precursor vapor to a deposition system according to an embodiment.
Figure 4:
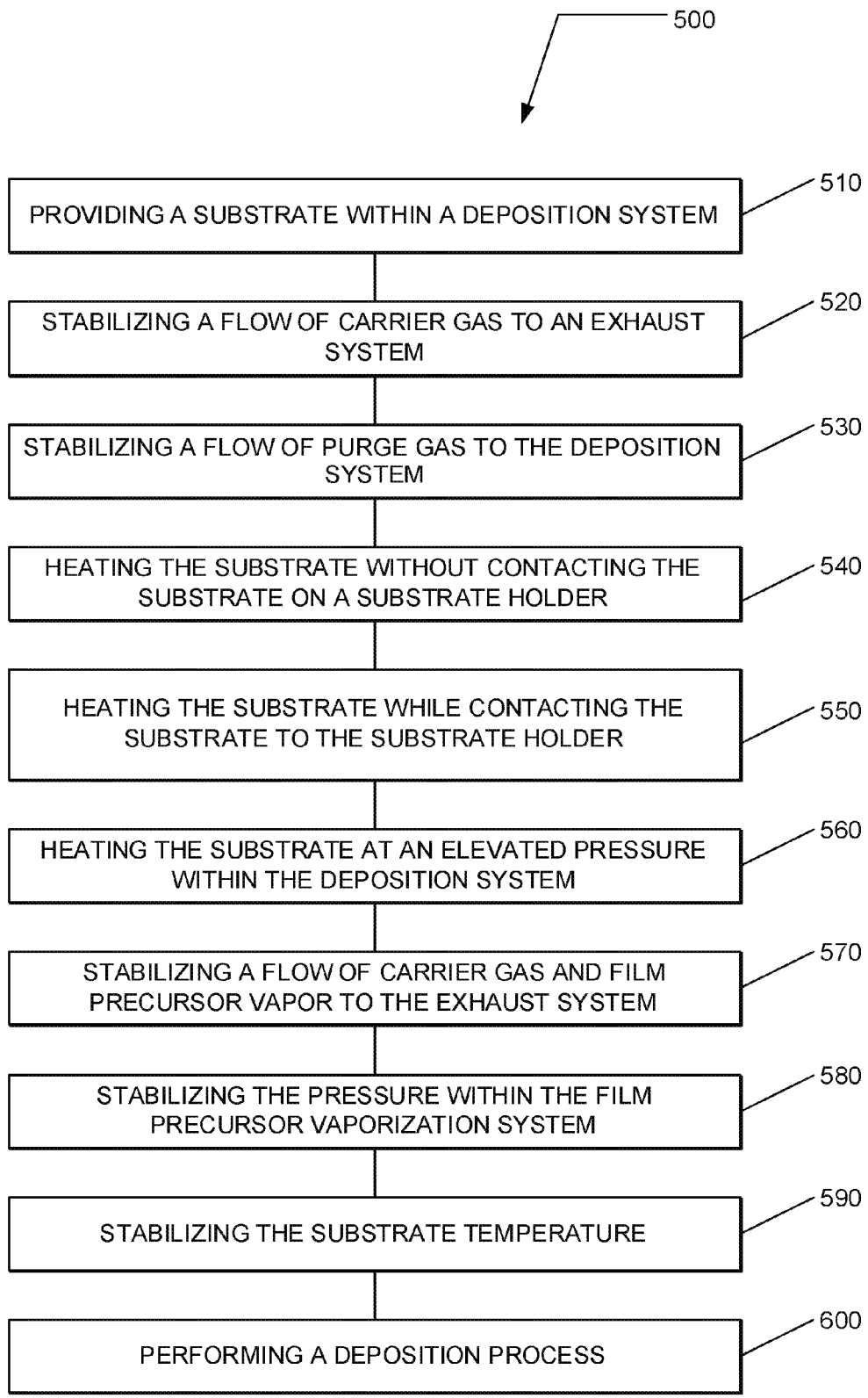
FIG. 4 illustrates a method of depositing a thin film on a substrate according to an embodiment.

As illustrated in FIG. 3A and FIG. 4 in step 520, a flow of carrier gas 380 from a gas supply system 360 is initiated and stabilized through a by-pass gas line 367 to an exhaust system 318 when control valve 368 is open. The exhaust system 318 may be independent from the evacuation system coupled to the deposition system 310, or it may be the same. The flow of carrier gas 380 to the exhaust system 318 is performed to release any accumulation of pressure within the gas supply system 360 and it is performed for a period of time sufficiently long to stabilize the flow rate of carrier gas at, for example, a flow rate consistent with the deposition process conditions (i.e., a deposition condition flow rate). The period of time may range from approximately 1 to approximately 30 seconds and, desirably, the period of time may range from approximately 1 to approximately 10 seconds; for instance, approximately 3 seconds.

Additionally, in step 530, a flow of purge gas 385 from gas supply system 360 is initiated and stabilized through a purge gas line 370 to the deposition system 310 when control valve 372 is open. The flow of purge gas 385 facilitates the release of any pressure accumulation in the purge gas line 370 and the gas supply system 360.

During this time, the chamber pressure is not controlled, e.g., maximum pumping speed is delivered to the deposition system 310. Furthermore, in step 540, while the substrate holder (or substrate pedestal) is raised to an elevated temperature (above room temperature and at or near the deposition condition temperature), the substrate rests on lift pins in close proximity of the upper surface of the substrate holder in order to pre-heat the substrate prior to making direct thermal contact between the relatively cold substrate and the relatively hot substrate holder. In doing so, the risk of damaging the substrate due to thermal shock is reduced. The spacing between the substrate and the substrate holder may range from approximately 1 mm to approximately 20 mm and, desirably, the spacing may range from approximately 1 mm to approximately 10 mm; for instance, approximately 5 mm. During this time, no film deposition occurs, i.e., carrier gas with precursor vapor does not flow to the deposition system 310 by virtue of control valve 342 in vapor delivery line 340 being in a closed position.

The gas supply system 360 can comprise a first gas source 361 configured to introduce a first inert gas, such as a noble gas (e.g., argon), through a flow valve 375 downstream of the film precursor vaporization system 350, and a second gas source 362 configured to introduce a second inert gas, such as a noble gas (e.g., argon), through another flow valve 373 upstream of the film precursor vaporization system 350. Additionally, the gas supply system 360 can comprise a third gas source 363 configured to introduce a monoxide gas, such as carbon monoxide (CO), through yet another flow valve 374 upstream of the film precursor vaporization system 350. Furthermore, the gas supply system 360 can comprise a fourth gas source 364 configured to introduce an inert gas, such as a noble gas (e.g., argon), through the purge gas line 370 to the deposition system 310. Although exemplary gases are provided above for gas sources 361, 362, 363 and 364, each gas source may supply other gases as would understood by one skilled in the art of process engineering for electronic device manufacturing. Additionally, as provided above, the gas supply system 360 can include a carrier gas source, a carbon monoxide (CO) gas source, a purge gas source, one or more control valves, one or more filters, one or more flow conditioning devices, and one or more mass flow controllers for introducing various flows, as described above and below, to deposition system 310.

For example, as illustrated in FIG. 3A, the flow of carrier gas to exhaust system 318 can include a flow of inert gas from the first gas source 361 through flow valve 375 (when open), and a flow of carbon monoxide (CO) from the third gas source 363 through flow valve 374 (when open) and through a by-pass valve 377 (when open) that by-passes the film precursor vaporization system 350. Entry valve 376 to the film precursor vaporization system 350 and exit valve 378 out of the film precursor vaporization system 350 are thus closed when by-pass valve 377 is open.

Figure 3B:
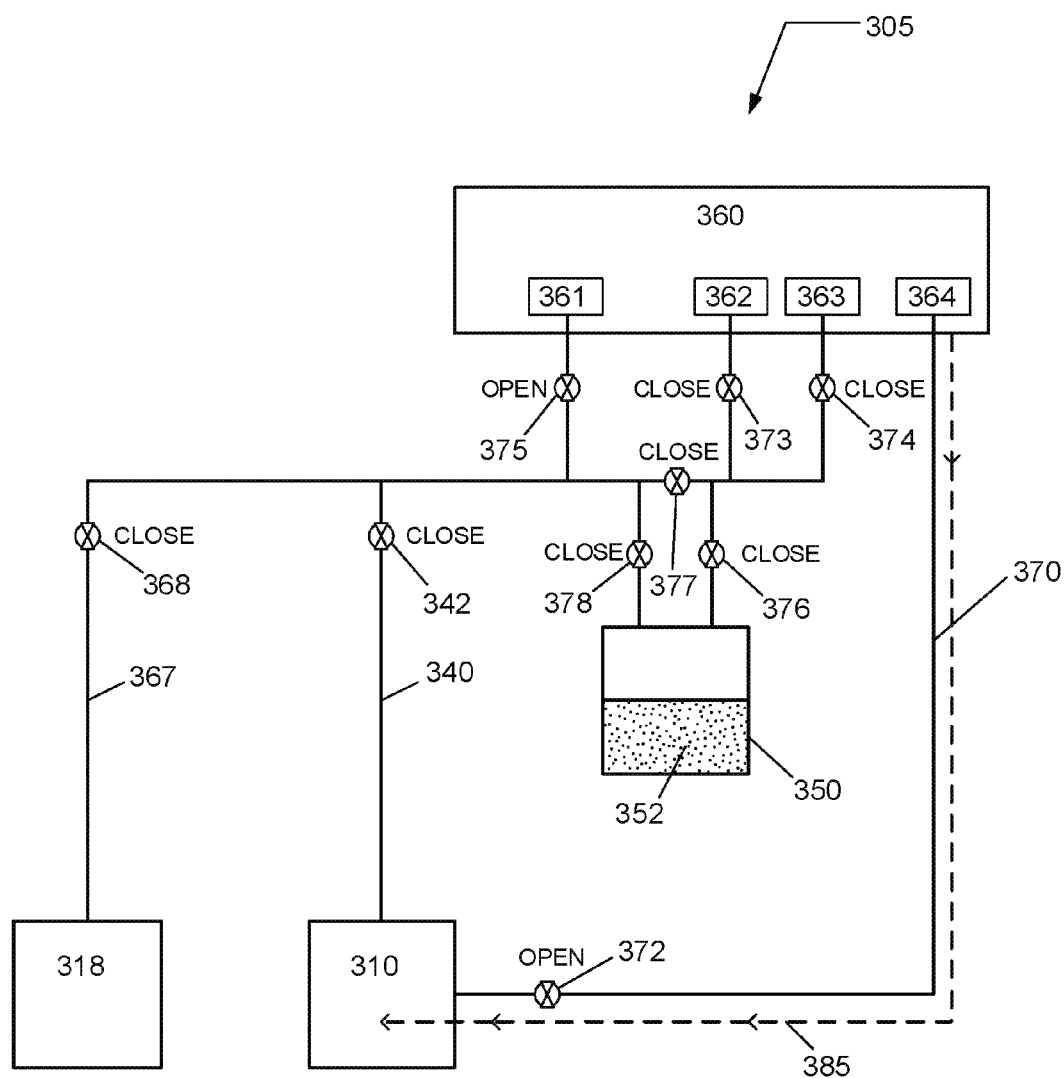

As illustrated in FIG. 3B and FIG. 4 in step 550, the substrate is heated while in contact with the substrate holder. The flow of purge gas 385 from gas supply system 360 is continued through the purge gas line 370 to the deposition system 310 when control valve 372 is open. Additionally, the substrate is lowered to the upper surface of the substrate holder, whereby thermal contact is made, and the substrate is heated to the deposition condition temperature (i.e., a temperature determined for the deposition process conditions). During this time, no film deposition occurs, i.e., carrier gas with precursor vapor does not flow to the deposition system 310 by virtue of control valve 342 in vapor delivery line 340 remaining in the closed position. The flow of carrier gas 380 to the exhaust system 318 may be discontinued during step 550 (e.g., valves 368, 374, 375 and 377 are closed).

Figure 3C:
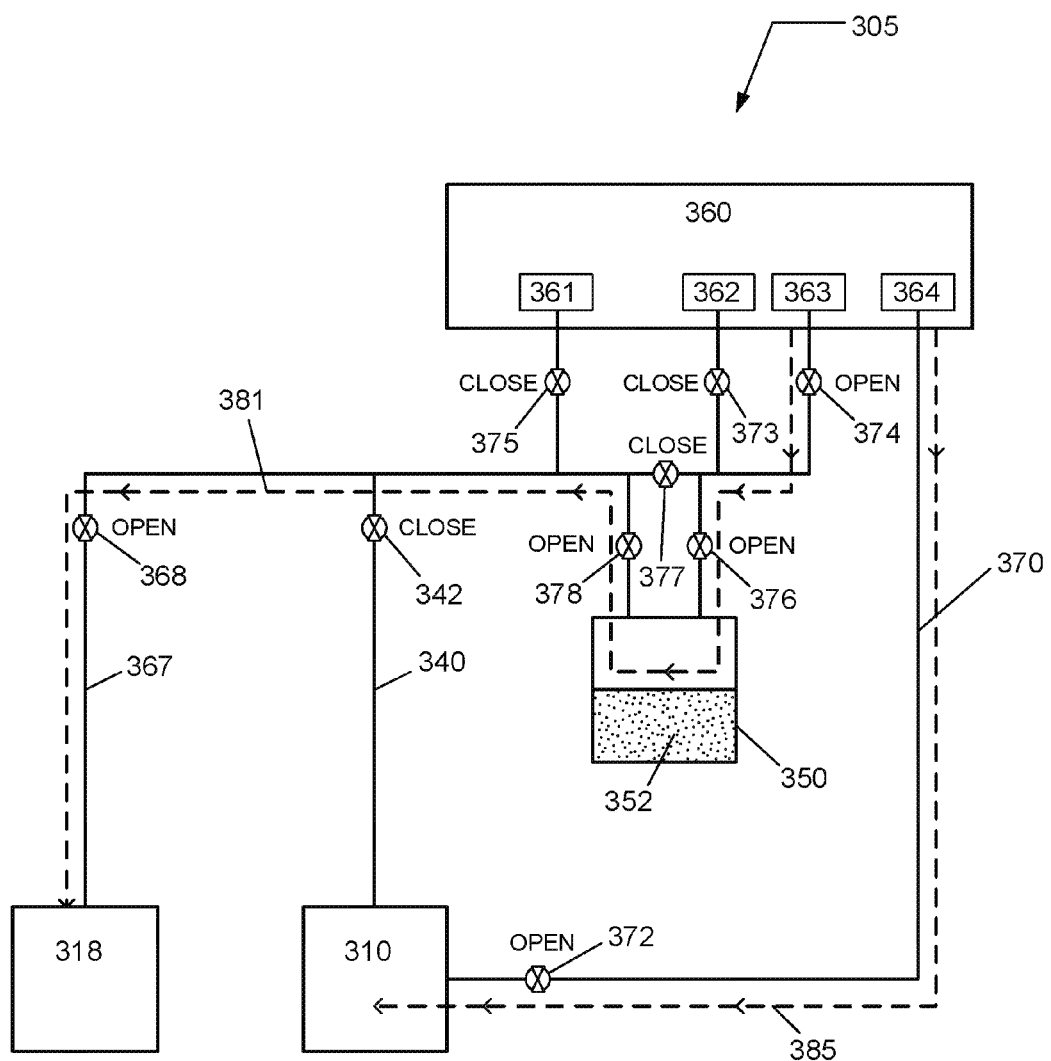

As illustrated in FIG. 3C and FIG. 4 in step 560, the substrate is heated at an elevated pressure within the deposition system 310. The flow of purge gas 385 from gas supply system 360 is continued through the purge gas line 370 to the deposition system 310 when control valve 372 is open, while heating of the substrate also continues. Yet, the chamber pressure is controlled at a relatively high pressure in order to assist the conduction of heat from the substrate holder to the substrate. The chamber pressure may range from approximately 0.1 Torr to approximately 1000 Torr and, desirably, the chamber pressure may range from approximately 1 Torr to approximately 10 Torr; for instance, approximately 2 Torr.

Additionally, as illustrated in FIG. 3C and FIG. 4 in step 570, the flow rate of carrier gas and film precursor vapor is stabilized at the deposition condition flow rate. To that end, a flow of carrier gas is established through the film precursor vaporization system 350 and the film precursor 352 within the film precursor vaporization system 350 is heated. The carrier gas can, for example, include carbon monoxide (CO) that is supplied from the third gas source 363 through flow valve 374 (when open). The carrier gas enters the film precursor vaporization system 350 through entry valve 376 when this valve is open and the by-pass valve 377 is closed. As described earlier, the film precursor 352 can comprise a metal carbonyl, such as solid ruthenium carbonyl ($Ru_3(CO)_{12}$), which sublimes to form precursor vapor that is entrained by the carrier gas. A flow of carrier gas and film precursor vapor 381 exits the film precursor vaporization system 350 through exit valve 378 (when open) and continues through the by-pass gas line 367 to the exhaust system 318 when control valve 368 is opened.

The flow of carrier gas and film precursor vapor 381 to the exhaust system 318 is performed for a period of time sufficiently long to stabilize the flow rate of carrier gas and film precursor vapor at, for example, a flow rate consistent with the deposition process conditions (i.e., the deposition condition flow rate). The period of time may range from approximately 1 to approximately 60 seconds and, desirably, the period of time may range from approximately 10 to approximately 30 seconds; for instance, approximately 20 seconds. During this time, the substrate in the deposition system 310 is heated and no film deposition occurs, i.e., carrier gas and precursor vapor does not flow to the deposition system 310 by virtue of control valve 342 in vapor delivery line 340 remaining in the closed position.

Figure 3D:
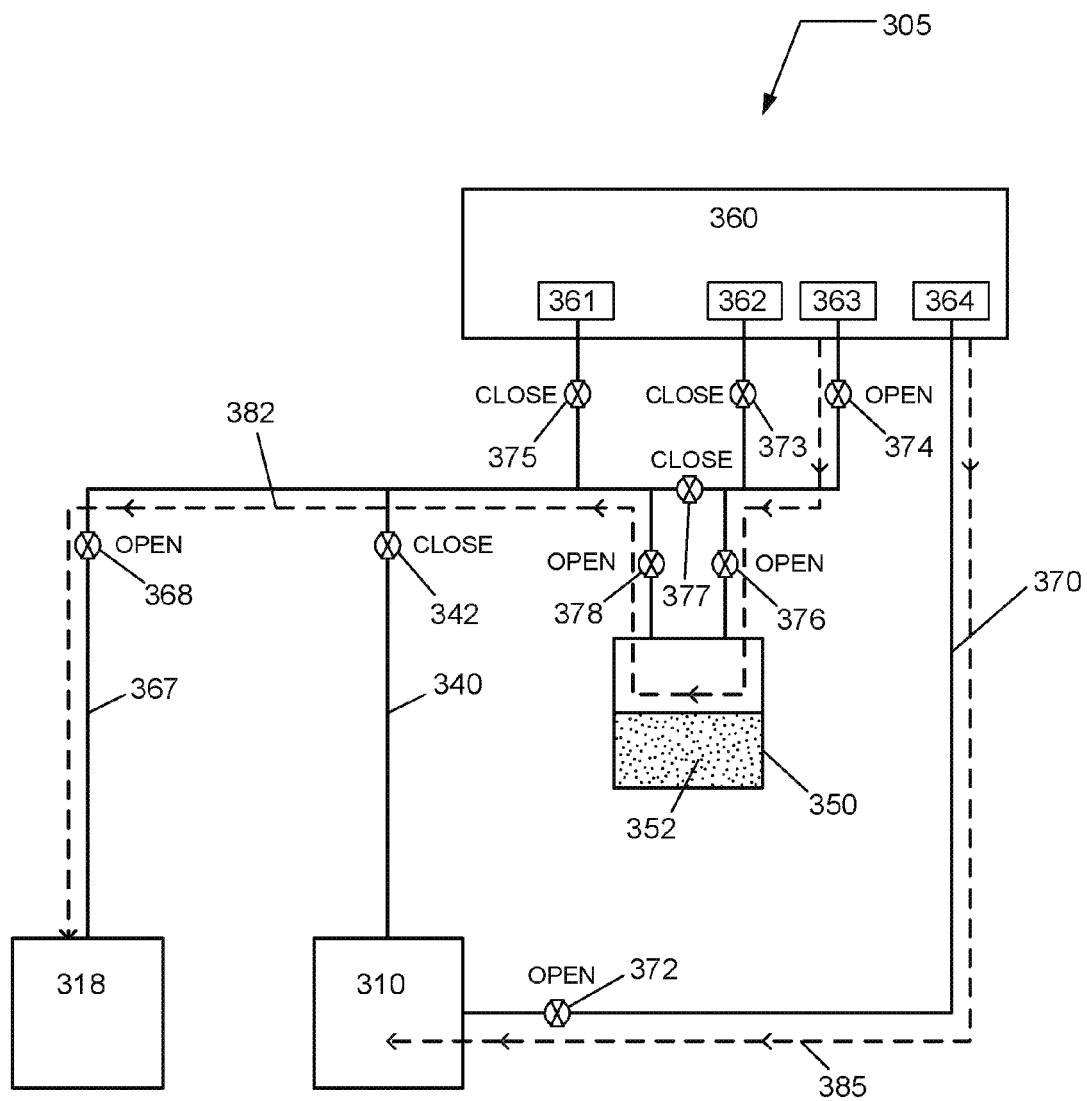

As illustrated in FIG. 3D and FIG. 4 in step 580, the gas pressure within the film precursor vaporization system 350 is stabilized. The flow of purge gas 385 from gas supply system 360 is continued through the purge gas line 370 to the deposition system 310 when control valve 372 is open, while heating of the substrate to the deposition temperature continues and the chamber pressure is controlled at a relatively high pressure. Additionally, a flow of carrier gas through the film precursor vaporization system 350 continues, but the flow rate of carrier gas is altered in order to establish a gas pressure within the film precursor vaporization system 350 and a resulting flow of carrier gas and precursor vapor 382 to the exhaust system 318 at a flow rate that would be consistent with a flow of carrier gas and film precursor vapor to the deposition system 310 through vapor delivery line 340 coupled to the deposition system 310 at the deposition condition flow rate.

For a given mass flow rate through either the vapor delivery line 340 or the by-pass gas line 367, a difference in the respective flow conductance (C) of each flow path or the pumping speed (S) delivered to an outlet of each flow path or a combination thereof may cause variations in the pressure upstream of each flow path in, for instance, the film precursor vaporization system 350. For a gaseous flow between a first location at pressure $P_2$ and a second location at pressure $P_1$, the ratio of the change in pressure ($\Delta P = P_2 - P_1$) along each flow path to the pressure at the second location ($P_1$), for instance, is related to the ratio of the pumping speed at the second location ($S_1$) to the flow conductance ($C_{12}$) along the flow path, i.e., $\Delta P/P_1 \sim S/C_{12}$.

For example, if the flow conductance of the by-pass gas line 367 to the exhaust system 318 is less than the flow conductance of the vapor delivery line 340 to the deposition system 310, the flow rate of carrier gas is reduced in order to adjust the gas pressure in the film precursor vaporization system 350 to a gas pressure consistent with the flow of carrier gas and film precursor vapor to the deposition system 310 at the deposition condition flow rate. Alternatively, if the flow conductance of the by-pass gas line 367 to the exhaust system 318 is greater than the flow conductance of the vapor delivery line 340 to the deposition system 310, the flow rate of carrier gas can be increased in order to adjust the gas pressure in the film precursor vaporization system 350 to the gas pressure consistent with the flow of carrier gas and film precursor vapor to the deposition system 310 at the deposition condition flow rate.

The altered flow of carrier gas through the film precursor vaporization system 350 is performed for a period of time sufficiently long to stabilize the gas pressure in the film precursor vaporization system 350 at, for example, a pressure consistent with the deposition process conditions (i.e., the deposition condition flow rate through the film precursor vaporization system 350). Alternatively, the altered flow of carrier gas through the film precursor vaporization system 350 is performed for a period of time sufficiently long to stabilize the gas pressure in the film precursor vaporization system 350 at, for example, a pre-determined target. A pressure measurement system may be coupled to the film precursor vaporization system 350 in order to monitor the gas pressure and determine whether the target pressure is achieved. The period of time may range from approximately 1 to approximately 30 seconds and, desirably, the period of time may range from approximately 1 to approximately 10 seconds; for instance, approximately 5 seconds. During this time, the substrate in the deposition system 310 is heated and no film deposition occurs, i.e., carrier gas and precursor vapor does not flow to the deposition system 310 by virtue of control valve 342 in vapor delivery line 340 remaining in the closed position.

Figure 3E:
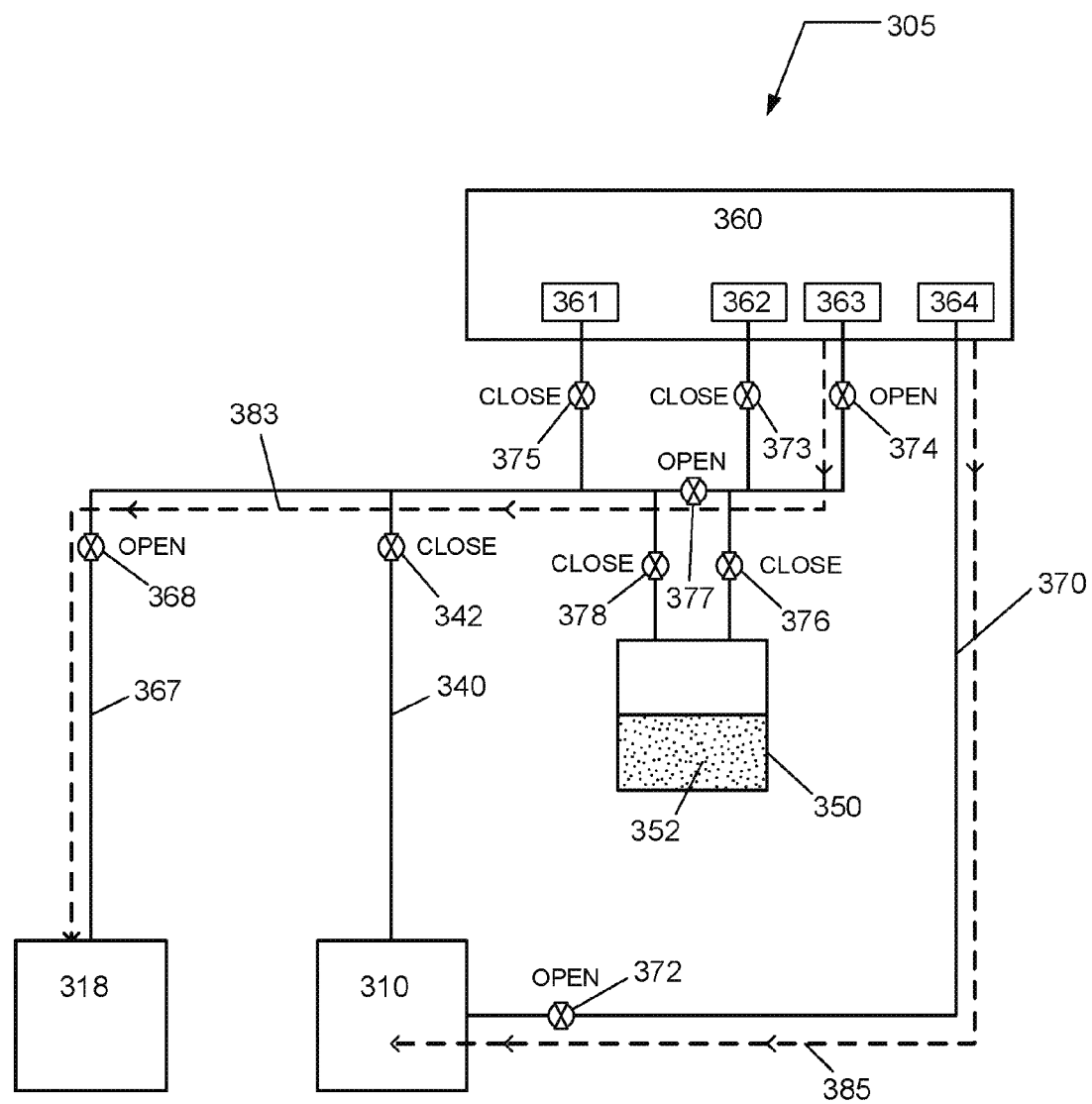

As illustrated in FIG. 3E, the flow of purge gas 385 from gas supply system 360 is continued through the purge gas line 370 to the deposition system 310 when control valve 372 is open, while heating of the substrate to the deposition temperature continues and the chamber pressure is controlled at a relatively high pressure. Once the substrate temperature reaches the elevated deposition temperature suitable for film deposition (approximately 200° C., as provided above), the substrate temperature is controlled (maintained) at the deposition condition temperature. Additionally, once the appropriate gas pressure is achieved within the film precursor vaporization system 350 as described in the preceding step, the film precursor vaporization system 350 is closed (by closing the entry valve 376 and exit valve 378), and a flow of carrier gas 383 continues through by-pass valve 377 (when open) to the exhaust system 318. During this time, the deposition temperature for the substrate in the deposition system 310 is achieved and controlled, and no film deposition occurs, i.e., carrier gas and precursor vapor does not flow to the deposition system 310 by virtue of control valve 342 in vapor delivery line 340 remaining in the closed position.

Figure 3F:
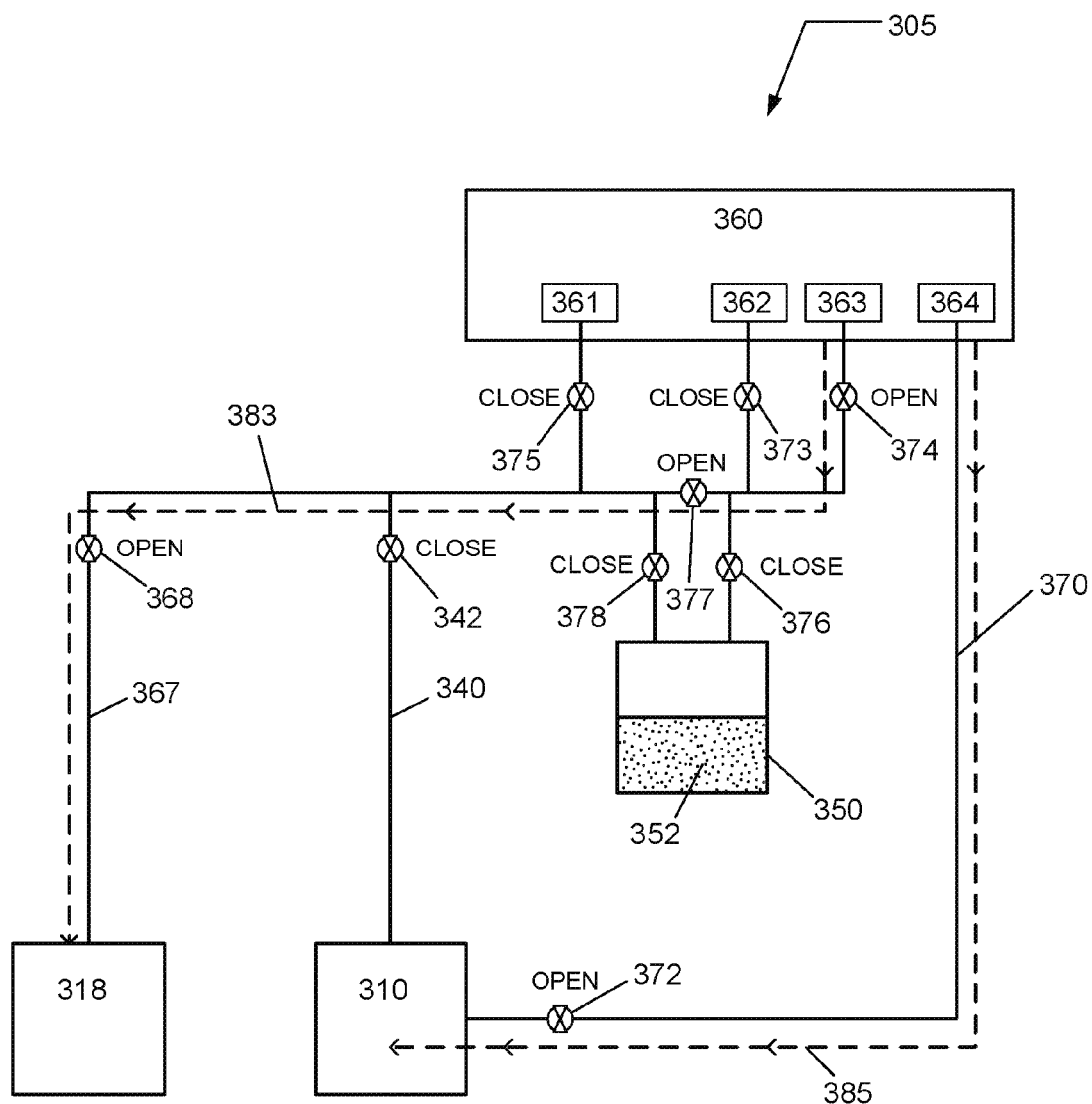

As illustrated in FIG. 3F, an altered flow of purge gas 386 from gas supply system 360 is continued through the purge gas line 370 to the deposition system 310 when control valve 372 is open. The flow is altered by reducing the flow rate of purge gas in order to reduce the chamber pressure to the deposition condition. The chamber pressure may range from approximately 0.1 mTorr (millitorr) to approximately 200 mTorr and, desirably, the chamber pressure may range from approximately 1 mTorr to approximately 200 mTorr; for instance, approximately 100 mTorr. Additionally, the flow of carrier gas 383 continues through by-pass valve 377 (when open) to the exhaust system 318. During this time, the deposition temperature for the substrate in the deposition system 310 is achieved and controlled, and no film deposition occurs, i.e., carrier gas and precursor vapor does not flow to the deposition system 310 by virtue of control valve 342 in vapor delivery line 340 remaining in the closed position.

Figure 3G:
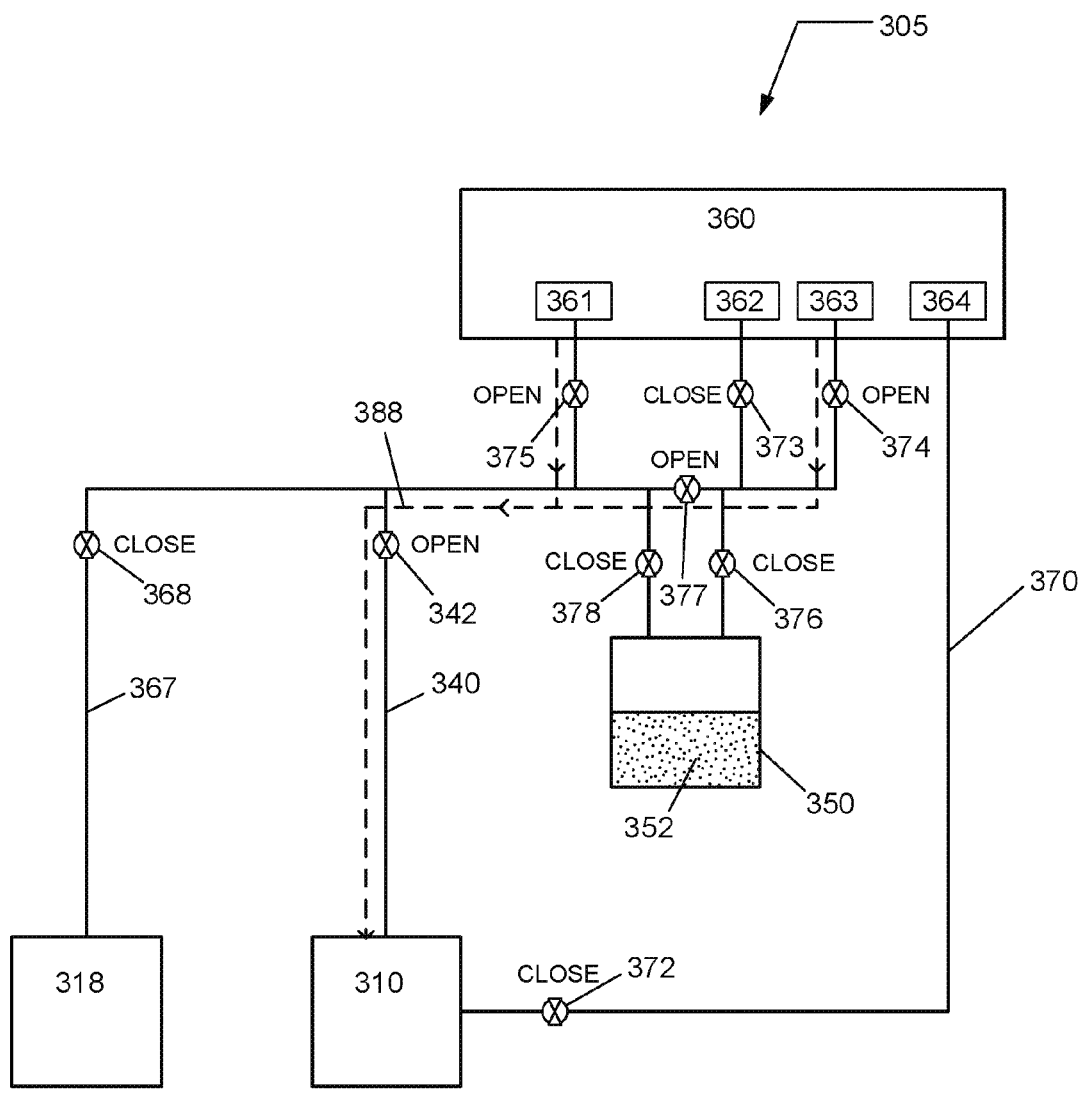

As illustrated in FIG. 3G and FIG. 4 in step 590, the temperature of the substrate is stabilized at the deposition temperature. The flow of purge gas 386 from gas supply system 360 is terminated, and a flow of carrier gas 388 without film precursor vapor (i.e., the film precursor vaporization system 350 remains closed) is introduced to the deposition system 310 through vapor delivery line 340 and control valve 342 (when open) at the deposition condition flow rate. The flow of carrier gas 388 can include the flow of carbon monoxide (CO) through flow valve 374 (when open) from the third gas source 363 in the gas supply system 360, and the flow of inert gas through flow valve 375 (when open) from the first gas source 361 in the gas supply system 360. The chamber pressure is controlled at the deposition pressure (approximately 0.1 Torr, as provided above).

The substrate deposition temperature can range from about 100° C. to about 500° C. and, desirably, the substrate deposition temperature can range from about 150° C. to about 350° C.; for instance, about 200° C. Due to the change in background gas from predominantly an inert gas, such as a noble gas (e.g., argon), to the carrier gas, which comprises a carbon monoxide (CO) component, fluctuations in substrate temperature have been observed. The temperature variations are believed to be caused by the difference in the thermal conductivity of the gas residing between the backside of the substrate and the substrate holder. Hence, the temperature variations persist for a period of time during which the carrier gas atmosphere to be used during the deposition process displaces the inert gas atmosphere used during the initial heating of the substrate. During this time, the substrate temperature in the deposition system 310 is controlled and no film deposition occurs, i.e., precursor vapor does not flow to the deposition system 310 by virtue of the entry and exit valves 376, 378 to and from film precursor vaporization system 350 remaining in the closed position.

Figure 3H:
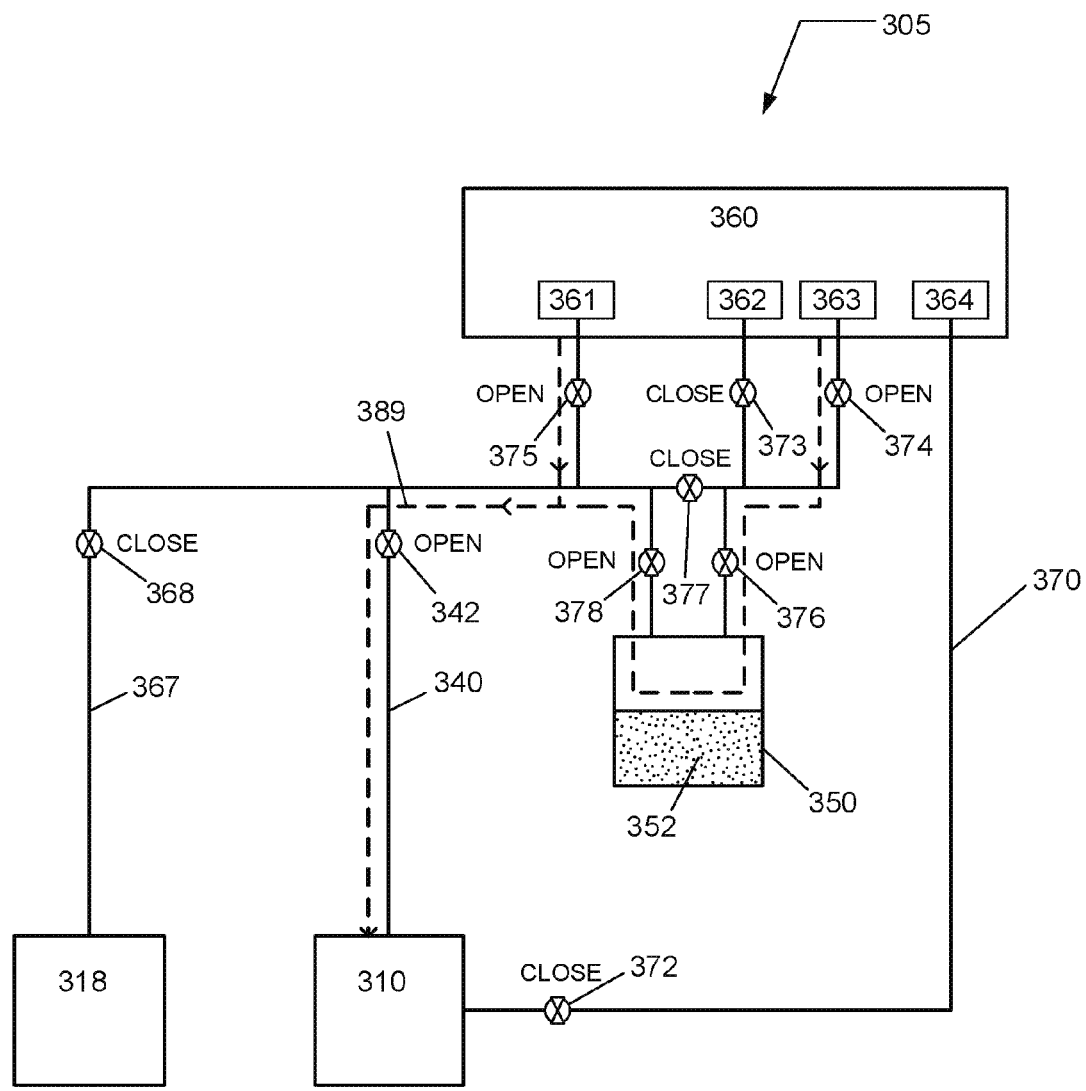

As illustrated in FIG. 3H and FIG. 4 in step 600, the deposition process is performed. A flow of carrier gas and film precursor vapor 389 is introduced to the deposition system 310 through the vapor delivery line 340 at the deposition condition flow rate. The flow of carrier gas can include the flow of carbon monoxide (CO) through flow valve 374 (when open) from the third gas source 363 in the gas supply system 360, through entry valve 376 (when open), through the film precursor vaporization system 350 to entrain film precursor vapor, and through exit valve 378 (when open), and can further include the flow of inert gas through flow valve 375 (when open) from the first gas source 361 in the gas supply system 360. The chamber pressure is controlled at the deposition pressure (approximately 0.1 Torr, as provided above). The substrate temperature is controlled at the deposition temperature (approximately 200° C., as provide above). The time period for the deposition process is chosen to be sufficiently long to affect the deposition of a film of a desired thickness.

As would be appreciated by those skilled in the art, each of the steps or stages in the flowchart of FIG. 4 may encompass one or more separate steps and/or operations. Accordingly, the recitation of only ten steps in 510, 520, 530, 540, 550, 560, 570, 580, 590, and 600 should not be understood to limit the method solely to ten steps or stages. Moreover, each representative step or stage 510, 520, 530, 540, 550, 560, 570, 580, 590, 600 should not be understood to be limited to only a single process.

Figure 5A:
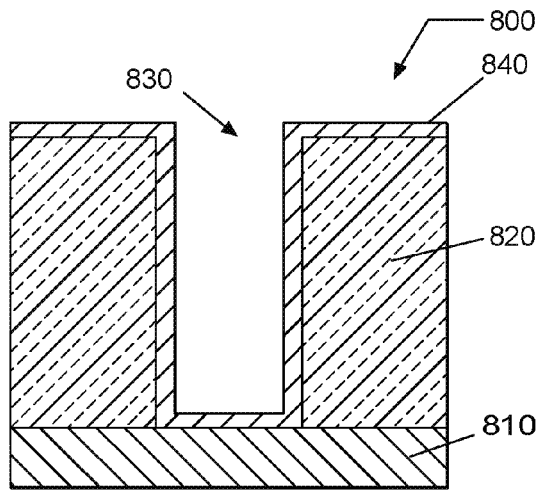
FIGS. 5A through 5C schematically show, in cross-sectional views, formation of a metal layer on a patterned substrate according to another embodiment.
Figure 5B:
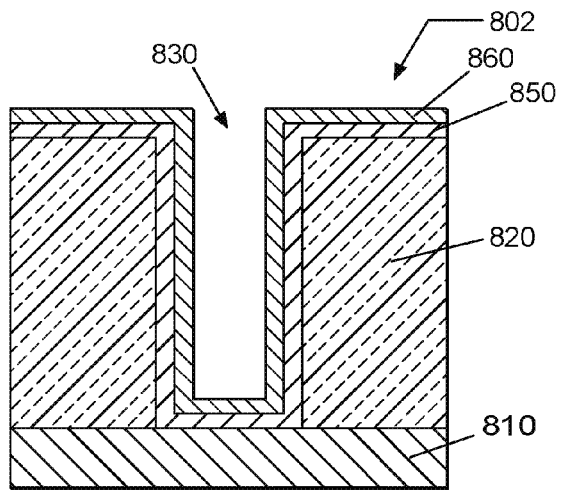
Figure 5C:
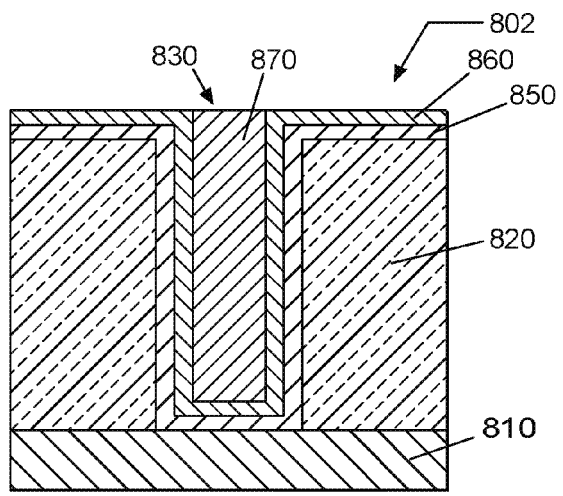

FIGS. 5A through 5C schematically show formation of a metal layer on a patterned substrate according to embodiments of the invention. As those skilled in the art will readily appreciate, embodiments of the invention can be applied to patterned substrates containing one or more vias or trenches, or combinations thereof. FIG. 5A schematically shows deposition of a metal layer 840 onto a patterned structure 800 according to an embodiment of the invention. The patterned structure 800 contains a first metal layer 810, and a patterned layer 820 containing an opening 830. The patterned layer 820 can, for example, be a dielectric material. The opening 830 can, for example, be a via or a trench, and the metal layer 840 can, for example, contain Ru metal.

FIG. 5B schematically shows deposition of a metal layer 860 onto a patterned structure 802 according to another embodiment of the invention. The patterned structure 802 contains a first metal layer 810 and a patterned layer 820 containing an opening 830. A barrier layer 850 is deposited onto the patterned structure 802, and a metal layer 860 is deposited on the barrier layer 850. The barrier layer 850 can, for example, contain a tantalum-containing material (e.g., Ta, TaN, or TaCN, or a combination of two or more thereof) or a tungsten material (e.g., W, WN). The patterned layer 820 can, for example, be a dielectric material. The opening 830 can, for example, be a via or a trench, and the metal layer 860 can, for example, contain Ru metal. FIG. 5C schematically shows deposition of Cu in the opening 830 of FIG. 5B.

The metal layers 840 and 860 may be deposited, as described above, using a process gas comprising a metal carbonyl precursor, for example a ruthenium carbonyl, and carbon monoxide (CO). An initial flow of the process gas is first established for a period of time to achieve a steady flow rate before introduction to the deposition chamber. The steady flow of the process gas is then introduced into the chamber for deposition of the metal layer 840 or 860 onto the patterned structure 800 or 802.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of depositing a thin film on a substrate, comprising:

providing said substrate within a deposition system configured to perform a deposition process;

heating said substrate to a deposition temperature;

providing an exhaust system;

providing a film precursor vaporization system coupled to said deposition system and said exhaust system, and configured to supply a film precursor vapor from a film precursor stored therein, said film precursor vaporization system having an entrance valve and an exit valve configured to open or close said film precursor vaporization system to gas flow into and/or out of said film precursor vaporization system;

determining a target pressure for operating said film precursor vaporization system during said deposition process;

opening said entrance and exit valves of said film precursor vaporization system and establishing a flow of carrier gas through said film precursor vaporization system to said exhaust system to establish a first flow of process gas containing said film precursor vapor and said carrier gas at a deposition flow rate to said exhaust system without introducing said first flow of process gas to said deposition system;

adjusting said first flow of process gas to said exhaust system to be at a different flow rate than said deposition flow rate in order to establish a gas pressure within said film precursor vaporization system that is substantially equivalent to said target pressure;

closing said entrance and exit valves of said film precursor vaporization system to terminate said first flow of said process gas while maintaining the flow of carrier gas to said exhaust system;

diverting the flow of carrier gas from said exhaust system to said deposition system at said deposition flow rate;

re-opening said entrance and exit valves of said film precursor vaporization system to direct said flow of carrier gas through said film precursor vaporization system and to said deposition system to establish a second flow of said process gas from said film precursor vaporization system to said deposition system at said deposition flow rate; and exposing said substrate at said deposition temperature to said process gas to deposit said thin film on said substrate using said deposition process.

2. The method of claim 1, wherein said heating said substrate to said deposition temperature comprises heating said substrate to a temperature ranging between about 50° C. and about 500° C.

3. The method of claim 1, wherein said heating said substrate to said deposition temperature comprises heating said substrate to a temperature ranging between about 150° C. and about 350° C.

4. The method of claim 1, wherein said establishing said first and second flows of process gas comprises:

heating said film precursor to form said film precursor vapor while flowing said carrier gas over or through said film precursor in said film precursor vaporization system.

5. The method of claim 4, wherein said film precursor comprises a metal carbonyl precursor whereby said heating said film precursor forms a metal carbonyl precursor vapor; and wherein said flowing said carrier gas over or through said film precursor comprises introducing a CO gas to said metal carbonyl precursor vapor within said film precursor vaporization system.

6. The method of claim 5, wherein said process gas further comprises an inert carrier gas.

7. The method of claim 6, wherein said inert carrier gas comprises a noble gas.

8. The method of claim 1, further comprising maintaining said deposition system at a pressure between about 0.1 mTorr and about 200 mTorr during said exposing.

9. The method of claim 1, further comprising:

introducing a flow of purge gas to said deposition system; and terminating said flow of purge gas prior to or concurrently with said establishing said second flow of process gas to said deposition system.

10. The method of claim 9, wherein said introducing said purge gas comprises introducing a noble gas, or CO gas, or a mixture thereof, to said deposition system.

11. The method of claim 1, wherein said film precursor vapor comprises a metal carbonyl precursor vapor.

12. The method of claim 11, wherein said metal carbonyl precursor vapor comprises a tungsten carbonyl, a molybdenum carbonyl, a cobalt carbonyl, a rhodium carbonyl, a rhenium carbonyl, a chromium carbonyl, a ruthenium carbonyl, or an osmium carbonyl, or a combination of two or more thereof.

13. The method of claim 11, wherein said metal carbonyl precursor vapor comprises $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

14. The method of claim 1, wherein said target pressure is selected to be substantially equivalent to said gas pressure within said film precursor vaporization system that is consistent with said second flow of said process gas containing said film precursor vapor and said carrier gas at said deposition flow rate to said deposition system at a deposition pressure.

15. The method of claim 1, wherein said adjusting said first flow of said process gas is performed for a duration of time of sufficient length to create a stable gas pressure at said target pressure within said film precursor vaporization system.

16. The method of claim 15, wherein said duration of time is approximately 1 second to approximately 20 seconds.

17. The method of claim 15, wherein said duration of time is approximately 2 seconds to approximately 10 seconds.

18. The method of claim 1, wherein said carrier gas comprises an inert gas.

19. The method of claim 1, wherein said carrier gas comprises CO gas.

20. The method of claim 1, wherein said re-opening is performed after said diverting.

21. The method of claim 1, wherein said re-opening is performed simultaneously with said diverting.

* * * * *